United States Patent

[11] 3,631,772

[72] Inventors Robert K. Curran
Stirling;
Robert E. Kerwin, Westfield, both of N.J.
[21] Appl. No. 840,315
[22] Filed July 9, 1969
[45] Patented Jan. 4, 1972
[73] Assignee Bell Telephone Laboratories, Incorporated
Murray Hill, N.J.

[54] METHOD AND APPARATUS FOR CHARACTERIZING PHOTORESIST
5 Claims, 4 Drawing Figs.

[52] U.S. Cl. .......... 95/1
[51] Int. Cl. .......... G03b 43/00
[50] Field of Search .......... 95/1; 350/31.4

[56] References Cited
UNITED STATES PATENTS

| | | | |
|---|---|---|---|
| 3,236,290 | 2/1966 | Lueder | 350/314 |
| 3,381,572 | 5/1968 | Tuwiner | 350/314 |

*Primary Examiner*—John M. Horan
*Attorneys*—R. J. Guenther and Edwin B. Cave

ABSTRACT: The margin for error in exposing photoresist during mask making is reduced by online use of a new test mask. The mask consists of a glass plate coated on one face with a gradient of deposited chromium. On the reverse face, in the direction of the gradient, a linear array of microtest patterns in chromium are deposited. Resolution capability and optimum exposure for a required resolution of circuit pattern and for a given batch of photoresist are determined by coating a sample wafer and exposing through the test mask.

TEST PATTERN

INVENTORS R. K. CURRAN
R. E. KERWIN
BY Charles E. Graves
ATTORNEY

METHOD AND APPARATUS FOR CHARACTERIZING PHOTORESIST

FIELD OF THE INVENTION

This invention involves methods for using photoresist materials in the masking steps in semiconductor fabrication; and more specifically, concerns a procedure and apparatus for rapidly characterizing the photoresist material.

BACKGROUND OF THE INVENTION

Photoresist material used as processing masks in semiconductor device manufacture is known to vary significantly in photoresponse and resolution capabilities, depending on its age, source and other factors. These parameters accordingly should be precisely known and applied for each photoresist batch used in device manufacture. Present practices, however, do not provide for a way to establish these parameters for the exact production conditions under which the photoresist is to be used.

Another aspect of characterizing a given photoresist batch is determining the characteristic curve, optical density vs. log exposure time. In this respect, too, present procedures are unduly slow and unsystematic.

Accordingly, a principal object of this invention is to reduce the margin for error in exposing photoresist material during processing stages in semiconductor device manufacture.

Another object of the invention is the rapid characterization of photoresist material under conditions of production use.

A further object of the invention is to simplify the analysis procedures for photoresist material.

SUMMARY OF THE INVENTION

The invention in one aspect involves a test mask configuration consisting of a clear glass plate coated on one face with a uniform or stepped gradient of deposited chromium. On the reverse face, and in the direction of the gradient, a linear array of microtest patterns in chromium are provided.

It is a feature of the invention that the same mask is used to determine optimum exposure for a desired resolution, as well as in constructing a standard characteristic curve for the photoresist material.

The invention and its further objects, features and advantages will be fully apprehended from a reading of the description to follow of an illustrative embodiment thereof.

THE DRAWING

FIG. 1 is a top view of a test mask embodying the invention;
FIG. 2 is a side schematic view of the test mask;
FIG. 3 is a bottom view of the test mask; and
FIG. 4 is a top schematic view of a single test pattern.

DETAILED DESCRIPTION OF AN ILLUSTRATIVE EMBODIMENT

Figure 1:
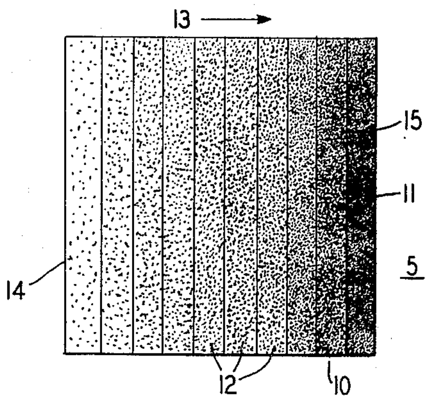
Figure 2:
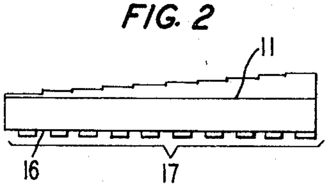

As shown in FIGS. 1 and 2, the test mask 5 comprises a glass substrate 10 which typically is 60-mils thick. On the top surface 11 of substrate 10 a coating of chromium shown exaggerated in thickness for illustration's sake, is deposited as by evaporation. The chromium coating in this embodiment is applied in steps designated 12, of uniformly increasing density in the direction of arrow 13. Alternatively the coating 12 can be applied in uniformly increasing concentration in one direction. The optical density of the first zone of chromium at edge 14, is approximately zero. The optical density increases, advantageously uniformly, to a value of about 3 in the last zone, at edge 15. For illustration, 10 steps 12 are shown, but an advantageous number in practice is 20 steps spaced-apart 0.1 inch. The chromium coating is of extremely fine grain size, at least 10 times smaller than the finest pattern detail. Alternative materials are iron oxide, $Fe_2O_3$, and vanadium oxide, $V_2O_5$. In general, any element or compound is suitable that can be deposited in a controlled manner to achieve the desired variation in optical density at wavelengths less than 400 nanometers.

Figure 3:
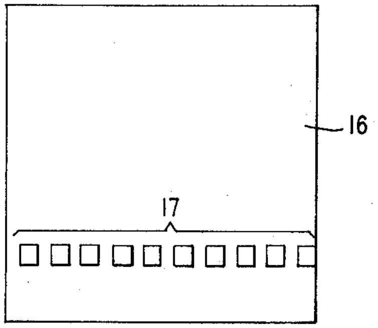
Figure 4:
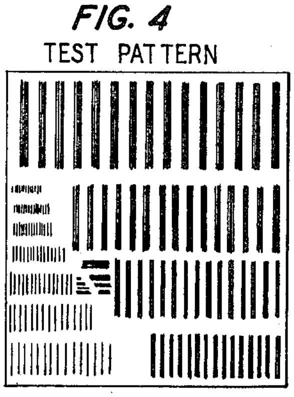

On the reverse face 16 of substrate 10, as shown in FIGS. 2 and 3, a linear array 17 of spaced Foucault or microtest patterns is placed in registration with the steps of the chromium step wedge, as shown; or at even distance increments in the case of the uniform gradient. The microtest patterns are also advantageously formed in chromium. Each pattern geometry consists of conventional line-frequency groups of alternating clear spaces and lines as shown in FIG. 4. Typically, the line width varies from 50 $\mu m$ to 1 $\mu m$ as between the widest and narrowest groups depending on the range of resolution to be tested. Array 17 is aligned in the direction of the optical density gradient indicated by the arrow 13.

USE OF TEST MASK

Each test mask is separately calibrated as to actual optical density of each step or, if a uniform gradient is used, as to the value of the optical density at points corresponding to the locations of the several test patterns.

The first use of the mask is in controlling the exposure of a specific photoresist on a substrate of interest. Consider, for example, a circuit pattern to be produced in a silicon-dioxide coating on a wafer, and having a given spacing between the pattern holes and islands. For a given batch of photoresist material, an operator is required to know what the resolution capability is as well as the optimum exposure for the required resolution of the holes and islands.

Pursuant to the invention, a wafer coated with the photoresist emulsion to be used is exposed through the mask 5 by the operator, using his standard mercury arc lamp and an exposure time typical of his usual practice in respect to photoresist of this type. The images from test pattern array 17 are developed; and a microscopic examination of the patterns is made. The resolution capability of the photoresist material is established by identifying the test pattern that appears optimally resolved, and inspecting the line groups of that pattern to determine at what line frequency the image becomes blurred. The resolution limit then is the last unblurred line group.

The optimum exposure time is established by identifying the density step on the test mask corresponding to the optimally resolved test pattern, and dividing the exposure time used by the antilog of the density of that step. The result reflects the proper exposure time to be used for the given lamp and light intensity.

From these test results, the exposure and resolution limitation are currently determined for the given photoresist batch, quickly and under the conditions to be encountered in actual use.

In its other major aspect, the inventive mask is used to produce data with which to plat the complete characteristic curve of the photoresist emulsion in question. Specifically, a coating of photoresist is applied to a clear quartz substrate and exposed through the mask 5. The photoresist is developed and the steps densitometrically scanned. Monochromatic light having a wavelength corresponding to an absorption maximum of the photoresist is used in this scan because the measured optical density will then be directly related to developed film thickness. Then, with a knowledge of the corresponding variation in the optical density of the chromium gradient on the test mask, the optical density vs. log exposure data for the photoresist is derived.

The optical density vs. log exposure curve reflects in its slope the photosensitivity of the photoresist material; and in the height of its plateau the polymer content of the specific batch of resist. These characterizations are used to quantitatively relate the performance of new photoresist batches with previously used ones.

It is to be understood that the embodiments described herein are merely illustrative of the principles of the invention. Various modifications may be made thereto by persons skilled in the art without departing from the spirit and scope of the invention.

What is claimed is:

1. A photoresist test mask comprising:

an optically transparent substrate;

a coating of granular matter on the substrate top surface, having an optical density gradient in a selected direction; and a plurality of identical microtest patterns arrayed linearly in said direction on the reverse side of said substrate, the grain size of said granular matter being substantially smaller than the finest detail present in said microtest pattern.

2. A test mask in accordance with claim 1, wherein said granular matter and said microtest patterns are deposited chromium.

3. A test pattern in accordance with claim 1, wherein said coating comprises a plurality of contiguous, rectangular zones of chromium deposited in increasing concentrations with each successive zone.

4. A test pattern in accordance with claim 3, wherein the optical densities of the successive said zones vary from approximately zero for a first edge zone to about three for the opposite edge zone, each optical density being calibrated.

5. A test pattern in accordance with claim 3, wherein said microtest patterns are aligned linearly across said zones, one such pattern registering with each zone.

* * * * *